(12) United States Patent
Englund

(10) Patent No.: US 10,312,387 B2
(45) Date of Patent: Jun. 4, 2019

(54) SINGLE PHOTON DETECTION USING A RESONATOR WITH AN ABSORBER

(71) Applicant: Massachusetts Institute of Technology, Cambridge, MA (US)

(72) Inventor: Dirk Robert Englund, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 140 days.

(21) Appl. No.: 15/436,372

(22) Filed: Feb. 17, 2017

(65) Prior Publication Data

US 2018/0013016 A1 Jan. 11, 2018

Related U.S. Application Data

(60) Provisional application No. 62/296,648, filed on Feb. 18, 2016.

(51) Int. Cl.
*H01L 31/0232* (2014.01)
*G02F 1/35* (2006.01)
*H01L 31/0304* (2006.01)
*H04B 10/70* (2013.01)
*G01J 1/44* (2006.01)

(52) U.S. Cl.
CPC ......... *H01L 31/02327* (2013.01); *G01J 1/44* (2013.01); *G02F 1/353* (2013.01); *G02F 1/3515* (2013.01); *H01L 31/02325* (2013.01); *H01L 31/03044* (2013.01); *H01L 31/03048* (2013.01); *H04B 10/70* (2013.01); *G01J 2001/442* (2013.01)

(58) Field of Classification Search
CPC . G02F 1/3515; G02F 1/353; H01L 31/02327; H01L 31/02325; H01L 31/08; H01L 31/09; H01L 31/03044; H01L 31/03048; H04B 10/70; G01J 1/44; G01J 2001/442; G01J 2001/4466; B82Y 20/00
See application file for complete search history.

(56) References Cited

U.S. PATENT DOCUMENTS 6,697,548 B2 2/2004 LoCascio et al.
7,092,590 B2 8/2006 Lim et al.
(Continued)

OTHER PUBLICATIONS

International Search Report and Written Opinion dated May 4, 2017, in regards to international application No. PCT/US2017/018329, 15 pages.
(Continued)

*Primary Examiner* — Que Tan Le
*Assistant Examiner* — Jennifer D Bennett
(74) *Attorney, Agent, or Firm* — Smith Baluch LLP

(57) ABSTRACT

A single photon detector (SPD) includes a resonator to store probe photons at a probe wavelength and an absorber disposed in the resonator to absorb a signal photon at a signal wavelength. The absorber is also substantially transparent to the probe photons. In the absence of the signal photon, the resonator is on resonance with the probe photons, thereby confining the probe photons within the resonator. Absorption of the signal photon by the absorber disturbs the resonant condition of the resonator, causing the resonator to release multiple probe photons. A photodetector (PD) then detects these multiple probe photons to determine the presence of the signal photon.

21 Claims, 10 Drawing Sheets

(56) References Cited

U.S. PATENT DOCUMENTS

| | | | |
|---|---|---|---|
| 7,903,445 B2 | 3/2011 | Song et al. | |
| 8,405,020 B2 | 3/2013 | Menge | |
| 9,810,578 B2* | 11/2017 | Pein | G01J 5/046 |
| 2004/0114930 A1* | 6/2004 | Krug | B82Y 20/00 398/79 |
| 2008/0128023 A1* | 6/2008 | Arianpour | H01L 31/02168 136/261 |
| 2009/0297094 A1* | 12/2009 | Hochberg | B82Y 20/00 385/14 |
| 2011/0038033 A1* | 2/2011 | Oohata | H04B 10/70 359/326 |
| 2013/0187051 A1* | 7/2013 | McCaughan | H01L 39/02 250/340 |

OTHER PUBLICATIONS

Pelton et al., Efficient Source of Single Photons: A Single Quantum Dot in a Micropost Microcavity. Phys. Rev. Lett. 89 , (2002). 4 pages.
Pierret, Advanced Semiconductor Fundamentals (Prentice Hall, 2003). 229 pages.
Pingault et al., All-optical formation of coherent dark states of silicon-vacancy spins in diamond. Physical Review Letters. Dec. 22, 2014;113(26):263601. 5 pages.
Ralph et al., Quantum computation with optical coherent states. Physical Review A. Oct. 20, 2003;68(4):042319. 11 pages.
Reiserer et al., A quantum gate between a flying optical photon and a single trapped atom. Nature. Apr. 2014;508 (7495):237.
Reiserer et al., Nondestructive detection of an optical photon. Science. Dec. 13, 2013;342(6164):1349-51.
Rogers et al., All-optical initialization, readout, and coherent preparation of single silicon-vacancy spins in diamond. Physical Review Letters. Dec. 22, 2014;113(26):263602. 5 pages.
Rogers et al., Electronic structure of the negatively charged silicon-vacancy center in diamond. Physical Review B. Jun. 2, 2014;89(23):235101. 8 pages.
Rogers et al., Multiple intrinsically identical single-photon emitters in the solid state. Nature communications. Aug. 27, 2014;5:4739. 6 pages.
Salem et al., High-speed optical sampling using a silicon-chip temporal magnifier. Optics Express. Mar. 16, 2009;17(6):4324-9.
Scarani et al., Quantum cryptography with finite resources: Unconditional security bound for discrete-variable protocols with one-way postprocessing. Physical Review Letters. May 22, 2008;100(20):200501. 4 pages.
Sekoguchi et al., Photonic crystal nanocavity with a Q-factor of~ 9 million. Optics Express. Jan. 13, 2014;22(1):916-24.
Shiue et al., High-responsivity graphene—boron nitride photodetector and autocorrelator in a silicon photonic integrated circuit. Nano Letters. Oct. 7, 2015;15(11):7288-93.
Simon et al., Polarization-induced Zener tunnel junctions in wide-band-gap heterostructures. Physical Review Letters. Jul. 7, 2009;103(2):026801. 4 pages.
Sipahigil et al., Indistinguishable photons from separated silicon-vacancy centers in diamond. Physical Review Letters. Sep. 11, 2014;113(11):113602. 5 pages.
Soltani et al., Free-carrier electrorefraction and electroabsorption in wurtzite GaN. Optics Express. Sep. 21, 2015;23(19):24984-90.
Sternschulte et al., 1.681-eV luminescence center in chemical-vapor-deposited homoepitaxial diamond films. Physical Review B. Nov. 15, 1994;50(19):14554. 7 pages.
Tanaka et al., Dynamic control of the Q factor in a photonic crystal nanocavity. Nature Materials. Nov. 2007;6(11):862.
Thompson et al., Coupling a single trapped atom to a nanoscale optical cavity. Science. Jun. 7, 2013;340(6137):1202-5.
Tiecke et al., Efficient fiber-optical interface for nanophotonic devices. Optica. Feb. 20, 2015;2(2):70-5.
Tiecke et al., Nanophotonic quantum phase switch with a single atom. Nature. Apr. 2014;508(7495):241.

Van Enk et al., Entangled coherent states: Teleportation and decoherence. Physical Review A. Jul. 13, 2001;64(2):022313.
Vlastakis et al., Deterministically encoding quantum information using 100-photon Schrödinger cat states. Science. Nov. 1, 2013;342(6158):607-10. doi: 10.1126/science.1243289. 5 pages.
Wang et al., "Engineering superpositions of coherent states in coherent optical pulses through cavity-assisted interaction." Physical Review A 72.2 (2005): 022320. 5 pages.
Wang et al., Decoherence Dynamics of Complex Photon States in a Superconducting Circuit. Phys. Rev. Lett. 103 , (2009). 4 pages.
Wijesundara et al., SiC materials and processing technology. InSilicon carbide microsystems for harsh environments 2011 (pp. 33-95). Springer, New York, NY. 63 pages.
Witthaut et al., Photon sorters and QND detectors using single photon emitters. EPL (Europhysics Letters). Mar. 6, 2012;97(5):50007. 7 pages.
Xu et al., Breaking the delay-bandwidth limit in a photonic structure. Nature Physics. Jun. 2007;3(6):406.
Xu et al., Carrier-induced optical bistability in silicon ring resonators. Optics Letters. Feb. 1, 2006;31(3):341-3.
Zhang et al., Advances in InGaAs/InP single-photon detector systems for quantum communication. Light: Science & Applications. May 2015;4(5):e286.
Balasubramanian et al., Ultralong spin coherence time in isotopically engineered diamond. Nature Materials. May 2009;8(5):383. 6 pages.
Bernien et al., Heralded entanglement between solid-state qubits separated by three metres. Nature. May 2013;497(7447):86. 5 pages.
Birowosuto et al., Movable high-Q nanoresonators realized by semiconductor nanowires on a Si photonic crystal platform. Nature Materials. Mar. 2014;13(3):279. 7 pages.
Borregaard et al., Heralded quantum gates with integrated error detection in optical cavities. Physical Review Letters. Mar. 17, 2015;114(11):110502. 5 pages.
Braunstein et al., Quantum information with continuous variables. Reviews of Modern Physics. Jun. 29, 2005;77(2):513. 65 pages.
Brune et al., Observing the progressive decoherence of the "meter" in a quantum measurement. Physical Review Letters. Dec. 9, 1996;77(24):4887.4 pages.
Burek et al., High quality-factor optical nanocavities in bulk single-crystal diamond. Nature Communications. Dec. 16, 2014;5:5718. 7 pages.
Buttéet al.,"Effects of polarization in optoelectronic quantum structures." Polarization Effects in Semiconductors. Springer, Boston, MA, 2008. 467-511.
Chang et al., Quantum nonlinear optics—photon by photon. Nature Photonics. Sep. 2014;8(9):685. 10 pages.
Cirac et al., Quantum state transfer and entanglement distribution among distant nodes in a quantum network. Physical Review Letters. Apr. 21, 1997;78(16):3221. 4 pages.
Delteil et al., Generation of heralded entanglement between distant hole spins. Nature Physics. Mar. 2016;12(3):218. 12 pages.
Duan et al., Scalable photonic quantum computation through cavity-assisted interactions. Physical Review Letters. Mar. 25, 2004;92(12):127902.
Englund et al. "Ultrafast photonic crystal lasers." Laser & Photonics Reviews 2.4 (2008): 264-274.
Englund et al., Controlling cavity reflectivity with a single quantum dot. Nature. Dec. 2007;450(7171):857. 5 pages.
Englund et al., Time-resolved lasing action from single and coupled photonic crystal nanocavity array lasers emitting in the telecom band. Journal of Applied Physics. May 1, 2009;105(9):093110. 5 pages.
Englund et al., Ultrafast photon-photon interaction in a strongly coupled quantum dot-cavity system. Physical Review Letters. Mar. 2, 2012;108(9):093604. 4 pages.
Gan et al., Chip-integrated ultrafast graphene photodetector with high responsivity. Nature Photonics. Nov. 2013;7(11):883. 5 pages.
Grundmann et al., Multi-color light emitting diode using polarization? induced tunnel junctions. physica status solidic. Jun. 2007;4(7):2830-3.

(56) References Cited

OTHER PUBLICATIONS

Harris et al., Bosonic transport simulations in a large-scale programmable nanophotonic processor. arXiv Preprint arXiv:1507.03406 (2015). 8 pages.

Harris et al., Integrated source of spectrally filtered correlated photons for large-scale quantum photonic systems. Physical Review X. Dec. 19, 2014;4(4):041047. 10 pages.

Hepp et al., Electronic Structure of the Silicon Vacancy Color Center in Diamond. Phys. Rev. Lett. 112 , (2014). 5 pages.

Heuck et al., Improved switching using Fano resonances in photonic crystal structures. Optics Letters. Jul. 15, 2013;38(14):2466-8.

Heuck et al., On-demand single photon emission based on dynamic photon storage on a photonic integrated circuit. InEuropean Quantum Electronics Conference Jun. 21, 2015 (p. EB_3_4). Optical Society of America.

Huang et al., Low-voltage Si-Ge avalanche photodiode in 2015 IEEE 12th International Conference on Group IV Photonics (GFP) (IEEE, n.d.), pp. 41-42.

Hucul et al., Modular entanglement of atomic qubits using photons and phonons. Nature Physics. Jan. 2015;11(1):37. 6 pages.

Imamoğlu et al., Strongly interacting photons in a nonlinear cavity. Physical Review Letters. Aug. 25, 1997;79(8):1467. 4 pages.

Imoto et al., Quantum nondemolition measurement of the photon number via the optical Kerr effect. Physical Review A. Oct. 1, 1985;32(4):2287. 6 pages.

Jahnke et al., Electron—phonon processes of the silicon-vacancy centre in diamond. New Journal of Physics. Apr. 8, 2015;17(4):043011. 12 pages.

Kanno et al., Fiber-Remoted 96-GHz Radar System. 2015 IEEE Avionics and Vehicle Fiber-Optics and Photonics Conference (AVFOP). 2 pages.

Kimble, The quantum internet. Nature. Jun. 18, 2008;453(7198):1023. 8 pages.

Kok et al., Linear optical quantum computing with photonic qubits. Reviews of Modern Physics. Jan. 24, 2007;79(1):135.

Krishnamoorthy et al., Polarization-engineered GaN/InGaN/GaN tunnel diodes. Applied Physics Letters. Nov. 15, 2010;97(20):203502.4 pages.

Kuramochi et al., Large-scale integration of wavelength-addressable all-optical memories on a photonic crystal chip. Nature Photonics. Jun. 2014;8(6):474. 8 pages.

Leroux et al., Quantum confined Stark effect due to built-in internal polarization fields in (Al, Ga) N/GaN quantum wells. Physical Review B. Nov. 15, 1998;58(20):R13371. 4 pages.

Li et al., Abstract: V44.00010 : Long distance quantum communication using continuous variable encoding in APS March Meeting 2016 (American Physical Society, 2016). 1 page.

Maurer et al., Room-temperature quantum bit memory exceeding one second. Science. Jun. 8, 2012;336(6086):1283-6.

McKeever et al., Deterministic generation of single photons from one atom trapped in a cavity. Science. Mar. 26, 2004;303(5666):1992-4.

Monroe et al., A "Schrödinger Cat" superposition state of an atom. Science. May 24, 1996;272(5265):1131-6.

Mork et al., Photonic crystal Fano laser: terahertz modulation and ultrashort pulse generation. Physical Review Letters. Oct. 15, 2014;113(16):163901. 5 pages.

Müller et al., Optical signatures of silicon-vacancy spins in diamond. Nature Communications. Feb. 18, 2014;5:3328. 7 pages.

Nedeljkovic et al., Free-Carrier Electrorefraction and Electroabsorption Modulation Predictions for Silicon Over the 1-14-micron Infrared Wavelength Range. IEEE Photonics Journal. Dec. 2011;3(6):1171-80.

Nemoto et al., Nearly deterministic linear optical controlled-NOT gate. Physical Review Letters. Dec. 15, 2004;93(25):250502.

Neu et al., Single photon emission from silicon-vacancy colour centres in chemical vapour deposition nano-diamonds on iridium. New Journal of Physics. Feb. 21, 2011;13(2):025012. 22 pages.

Notaros et al., Band-Structure Approach to Synthesis of Grating Couplers with Ultra-High Coupling Efficiency and Directivity in Optical Fiber Communication Conference (Optical Society of America, 2015), p. Th3F.2. 3 pages.

Novotny et al., Antennas for light. Nature Photonics. Feb. 2011;5(2):83. 8 pages.

O'Brien et al., Photonic quantum technologies. Nature Photonics. Dec. 2009;3(12):687. 9 pages.

Ourjoumtsev et al., Generation of optical 'Schrödinger cats' from photon number states. Nature. Aug. 2007;448(7155):784. 3 pages.

Padmaraju et al., Resolving the thermal challenges for silicon microring resonator devices. Nanophotonics. Aug. 1, 2014;3(4-5):269-81.

Pant et al., Rate-distance tradeoff and resource costs for all-optical quantum repeaters, arXiv [quant-Ph] (2016). 16 pages.

Pearl et al., Three photon absorption in silicon for 2300-3300 nm. Applied Physics Letters. Sep. 29, 2008;93(13):131102.4 pages.

\* cited by examiner

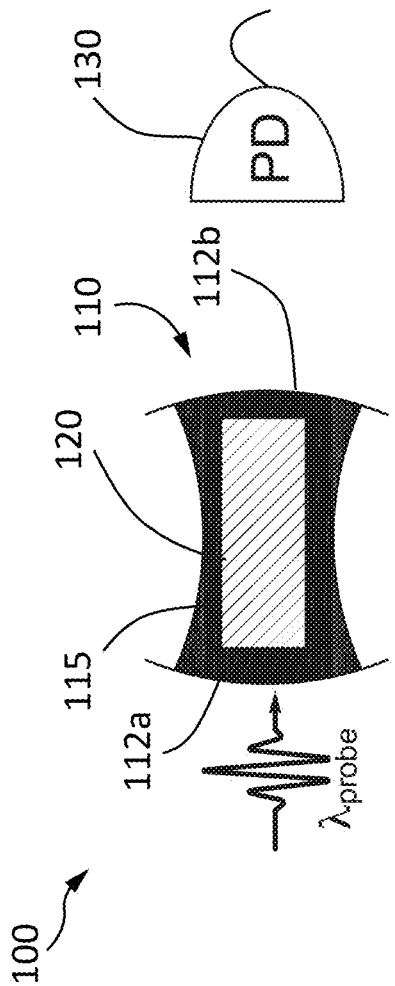
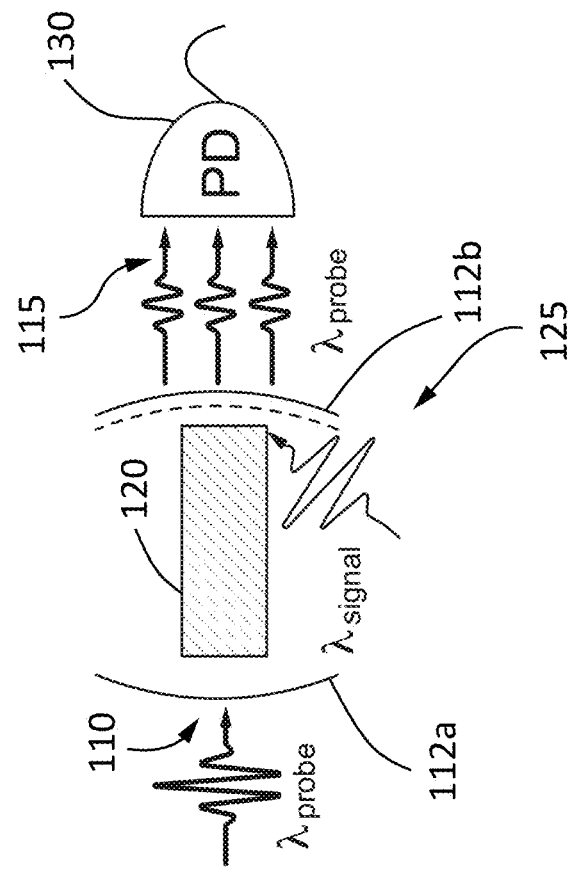
FIG. 1A
FIG. 1B

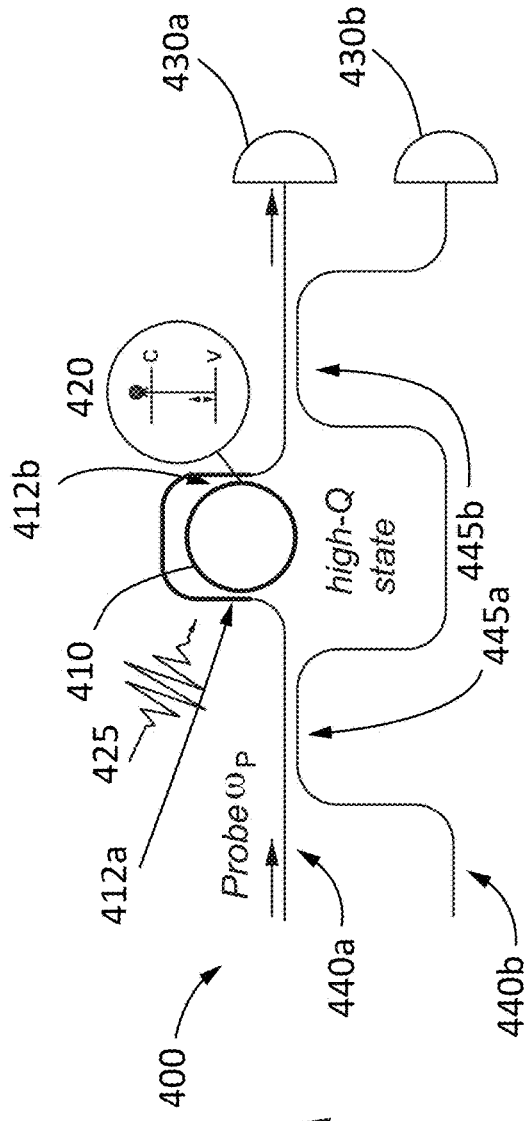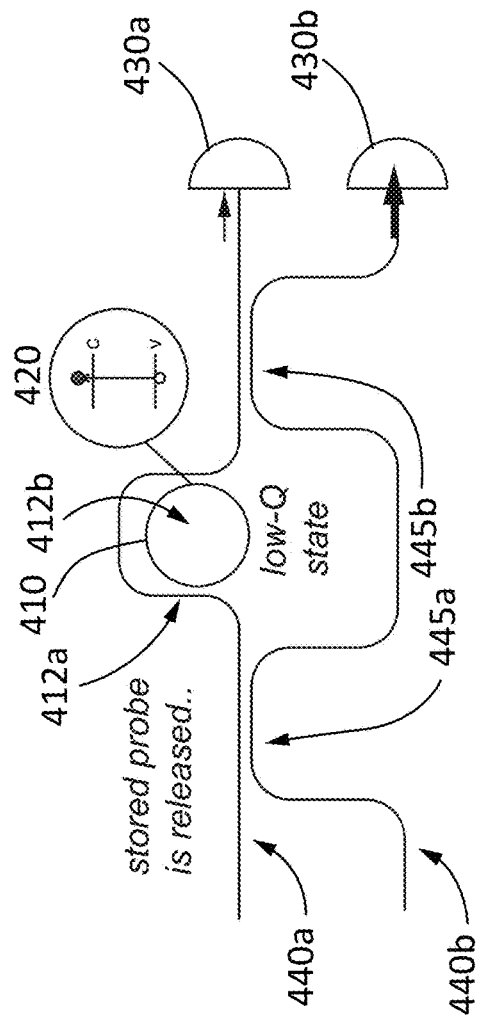
FIG. 4A
FIG. 4B

SINGLE PHOTON DETECTION USING A RESONATOR WITH AN ABSORBER

CROSS-REFERENCES TO RELATED APPLICATION(S)

This application claims priority to U.S. Application No. 62/296,648, filed Feb. 18, 2016, entitled "ULTRAFAST BROADBAND SINGLE PHOTON DETECTOR BASED ON CAVITY-ENHANCED ATOMIC ABSORPTION SPECTROSCOPY," which is hereby incorporated herein by reference in its entirety for all purposes.

BACKGROUND

Semiconductor-based single photon detectors (SPDs) are currently used in a wide range of areas, such as single molecule detection, fluorescent spectroscopy, optical fiber testing, basic quantum mechanics, and quantum information. These SPDs usually detect single photons via an electrical amplification process (also referred to as electrical avalanche process). In this process, a single photon first causes an atomic excitation, such as the generation of free electrons and holes, upon absorption by the semiconductor material in the SPD. The atomic excitations are then amplified through an electronic avalanche process. The amplified atomic excitations are then recorded as an electrical signal using thresholding and sampling mechanisms, followed by an analog-to-digital converter.

For example, in a state-of-the-art infrared (IR) Ge—Si avalanche photodetector (APD), a photon absorbed in the Ge region produces an electron-hole pair. The electron is accelerated under a bias voltage and tunnels into a Si avalanche region, where the electron is amplified above the electronic background noise. A thresholding mechanism then records the rising edge of the resulting electron pulse to determine the presence of the photon absorbed by the Ge region.

Single photon APDs can be constructed from several materials, such as germanium, GaAs, GaP, and GaAsP. However, the performance of these detector are usually limited by the optical absorption and electrical readout mechanisms. For example, jitter in the detectors can be caused or exacerbated by factors including the inhomogeneous travel time of carriers across the junction and the limited electrical readout bandwidth. Electronic defects in the amplification region can contribute to dark counts (also referred to as dark current), which can be particularly severe in non-Si APDs. In addition, despite decades of development of passive and active reset mechanisms, reset times are still on the order of hundreds of nanoseconds, which means that it takes at least hundreds of nanoseconds for a semiconductor-based SPD to detect a second photon after detecting the first one.

SUMMARY

Apparatus, systems, and methods described herein are generally related to single photon detection. In one example, an apparatus for detecting a signal photon at a first wavelength includes a resonator to store a plurality of probe photons at a second wavelength different from the first wavelength. An absorber is disposed at least partially in the resonator and substantially transparent to the plurality of probe photons to absorb the signal photon. Absorption of the signal photon causes a change of a resonant wavelength of the resonator and the change of the resonant wavelength causes release of at least some of the plurality of probe photons from the resonator. The apparatus also includes a detector, in optical communication with the resonator, to generate an electrical signal in response to detection of the at least some of the plurality of probe photons, the electrical signal indicating a presence of the signal photon.

In another example, a method of detecting a signal photon at a first wavelength includes coupling a plurality of probe photons at a second wavelength, different from the first wavelength, into a resonator. The resonator includes an absorber disposed at least partially in the resonator and substantially transparent to the plurality of probe photons. The method also includes absorbing the signal photon with the absorber. The absorber changes a resonant wavelength of the resonator in response to absorption of the signal photon, thereby releasing at least some of the plurality of probe photons from the resonator. The method also includes detecting the at least some of the plurality of probe photons and determining a presence of the signal photon based on detection of the at least some of the plurality of probe photons.

In yet another example, a single-photon detector to detect a signal photon at a signal wavelength includes an input waveguide to receive a plurality of probe photons at a probe wavelength less than half of the signal wavelength and a micro-ring resonator, evanescently coupled to the input waveguide, to receive the plurality of probe photons. The input waveguide includes a first section and a second section. The first section is evanescently coupled to a first location of the micro-ring resonator to couple out a first portion of the plurality of probe photons. The second section is evanescently coupled to a second location of the micro-ring resonator to couple out a second portion of the probe photons. The second portion destructively interferes with the first portion. The single photon detector also includes an absorber, disposed at least partially in the micro-ring resonator and substantially transparent at the probe wavelength, to absorb the signal photon. Absorption of the signal photon causes a change of a resonant wavelength of the micro-ring resonator releasing at least some of the plurality of probe photons from the micro-ring resonator. The absorber comprises a III-N semiconductor having a bandgap energy at least two times greater than a photon energy of the probe photons in the plurality of probe photons. The single photon detector further includes a detector, in optical communication with the resonator, to detect the at least some of the plurality of probe photons.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A shows a schematic of a photodetector including a resonator to store probe photons and an absorber disposed in the resonator in the absence of any signal photon.

FIG. 1B shows a schematic of the photodetector show in in FIG. 1A in the presence of a signal photon that triggers the release of probe photons stored in the resonator.

FIG. 4A shows a schematic of a photodetector including a ring resonator and a dynamic cavity switching mechanism before absorption of a signal photon.

FIG. 4B shows a schematic of the photodetector shown in FIG. 4A upon absorption of the signal photon.

DETAILED DESCRIPTION

Overview

Figure 2:
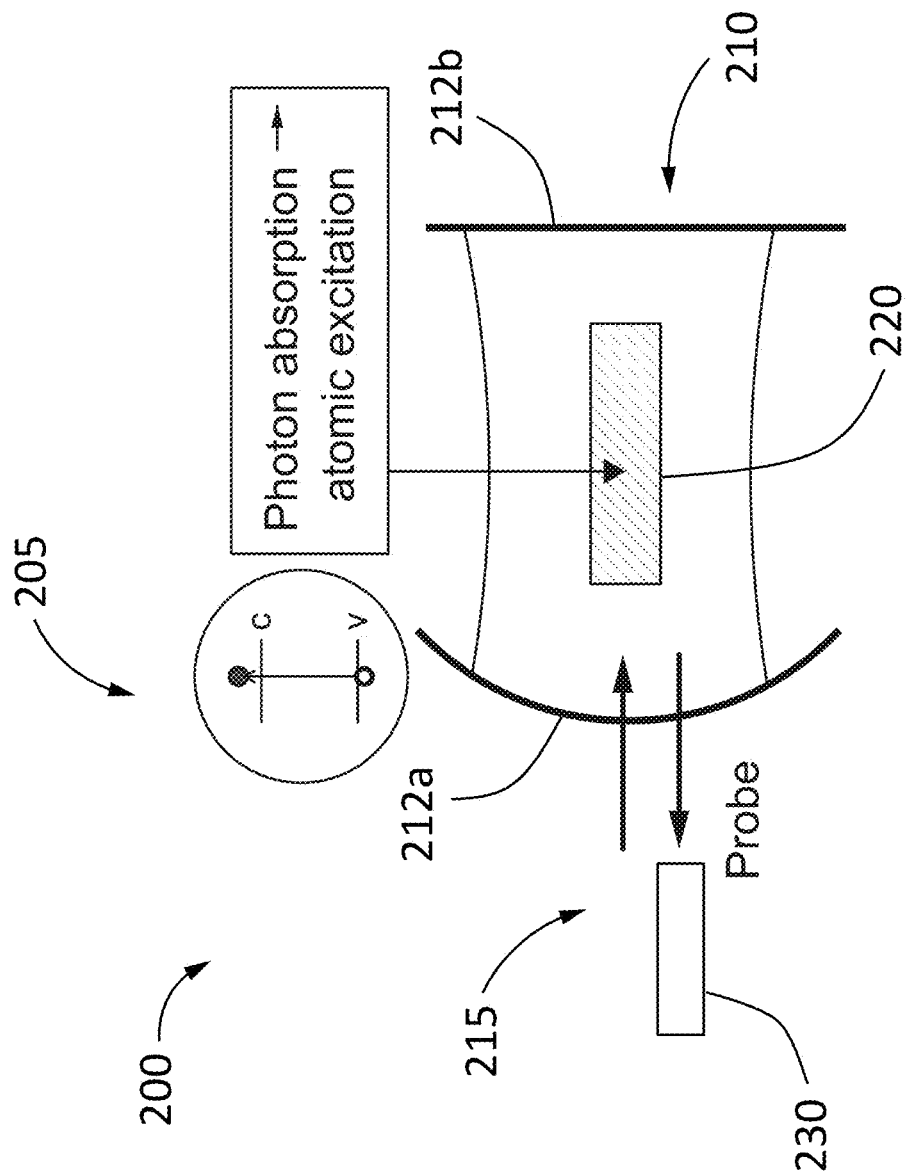
FIG. 2 shows a schematic of a photodetector including a single-sided resonator to store probe photons.

To overcome the limitations imposed by the electrical avalanche process in conventional semiconductor-based photon detectors, apparatus, systems, and methods described herein employ an optical avalanche process for single photon detection. In an optical avalanche process to detect a signal photon, a resonator is employed to store probe photons at a probe wavelength. An absorber is disposed in the resonator to absorb the signal photon at a signal wavelength different from the probe wavelength. The absorber is also substantially transparent to the probe photons (i.e., at the probe wavelength). In the absence of the signal photon, the resonator is on resonance with the probe photons, thereby confining the probe photons within the resonator. Absorption of the signal photon by the absorber, however, changes the resonant condition of the resonator (e.g., by changing the resonant wavelength of the resonator via free carrier dispersion). As a result, the resonator moves off resonance from the probe wavelength, thereby releasing multiple probe photons (e.g., more than 100 photons). In other words, the signal photon can function as a switch to open the floodgates of the probe photon reservoir (i.e., the resonator). A photodetector (PD) then detects these probe photons to determine the presence of the signal photon. Since multiple probe photons are released, the detection reliability and efficiency can be significantly improved.

Detectors based on optical avalanche have several advantages over conventional detectors based on electrical avalanche. First of all, limitations imposed by the electrical avalanche are usually reduced or eliminated. For example, the jitter performance of optical-avalanche-based detectors is not limited by the inhomogeneous travel time of carriers across the junction. Electronic defects in the amplification region in semiconductors may also contribute less to the dark counts.

In addition, avalanche in the optical domain can lead to lower thermal noise, lower channel attenuation, and larger signal bandwidth compared to the electrical avalanche used in conventional detectors. As a result, detectors described herein have the potential for much lower noise, extremely high readout bandwidths (e.g., on the order of THz or more) for nearly distortion-free propagation, low power consumption (e.g., less than mW), low dark counts, and parallel readout of many detectors by wavelength division multiplexing (WDM). Furthermore, the atomic excitation in optical avalanche can be reversible, which allows for quantum non-demolition (QND) readout for quantum limited detection of arbitrary optical pulses.

FIGS. 1A and 1B show schematics of a single-photon-detector (SPD) 100 based on optical avalanche in the absence and presence, respectively, of a signal photon 125 at a signal wavelength. The SPD 100 includes a resonator 110 defined by a first reflector 112a and a second reflector 112b. Probe photons 115 at a probe wavelength are resonating in the resonator 110. The signal wavelength is typically shorter than the probe wavelength. An absorber 120 is disposed in the resonator 110 and is substantially transparent to the probe photons 115. A photodetector (PD) 130 is disposed in optical communication with the resonator 110 to detect probe photons that leak out of the resonator 110.

In the absence of the signal photon 125, as shown in FIG. 1A, the probe photons 115 are in resonance with the resonator 110. In other words, the resonant wavelength of the resonator 110 is substantially equal to the probe wavelength. Without being bound by any particular theory of mode of operation, the resonant wavelength $\lambda_m$ of the resonator 110 can be calculated by:

$$\lambda_m = 2nL/m \qquad (1)$$

where $\lambda_m$ is the resonant wavelength of the mth order mode, m is a positive integer, n is the refractive index experienced by the probe photons 110 in the resonator 110, L is the length of the resonator 110. On resonance, the probe photons 110 are confined within the resonator 110 and the PD 130 detects little or no signal.

In the presence of the signal photon 125, the absorber 120 functions as an atomic switch that opens the floodgate of the probe photon reservoir (i.e., the resonator 110). As shown in FIG. 1B, the resonant wavelength $\lambda_m$ of the resonator 110 is changed by the absorption of the signal photon 125. Absorption of the signal photon 120 changes the refractive index of the absorber 120 and accordingly the refractive index n experienced by the probe photons. According to Equation (1), the change of the refractive index n leads to a change in the resonant wavelength $\lambda_m$ of the resonator 110, thereby causing the probe photons 115 to be off resonance with the resonator 110. In this case, probe photons 115 escape the resonator 110 and are detected by the PD 130 to indicate the presence of the signal photon 125 that initiates this release of probe photons 115.

The SPD 100 provides an all-optical avalanche of the single signal photon 125, turning it into a many-photon probe field that can be detected with low noise and high timing resolution by the detector 130 that can be a conventional photodetector. Since shot-noise limited detection can be achieved using heterodyne or homodyne detection with standard detectors, the probe signal can be weak while still providing a sufficient signal-to-noise ratio. For example, to achieve single-photon resolution, a Poisson-distributed probe pulse with about 30 photons can be generated from the absorption of the signal photon 125 to reach a bit error rate (BER) better than $\exp(-30)=10^{-13}$.

For illustrative purposes, FIGS. 1A-1B show a linear resonator 110 to store probe photons 115. In practice, various types of resonators can be used. For example, the resonator 110 can include a single-sided resonator (see, e.g., FIG. 2). In other examples, the resonator 110 can include a ring resonator (see, e.g., FIGS. 3A-3B and FIGS. 4A-4B). In yet another example, the resonator 110 can include a photonic crystal resonator (see, e.g., FIG. 5A).

In the absence of the signal photon 125, the resonant wavelength of the resonator 110 is substantially equal to the probe wavelength of the probe photons 115. The resonant wavelength can be substantially equal to or greater than 1.5 µm (e.g., about 1.5 µm, about 1.7 µm, about 1.9 µm, about 2.1 µm, about 2.3 µm, about 2.5 µm, about 2.7 µm, about 2.9 µm, about 3.1 µm, about 3.3 µm, or greater, including any values and sub ranges in between).

The quality factor of the resonator 110 can affect the signal-to-noise (S/N) ratio of the SPD 100. The quality factor can also affect the reset time because of the ring-down time r of the cavity (also referred to as the decay constant of a cavity), which refers to the time taken for the intensity of light to fall to 1/e of the initial intensity. Without being bound by any particular theory or mode of operation, the cavity ring-down time r can be calculated as $\tau=Q/\omega_p$, where $\omega_p$ is the angular frequency of the probe photons. Practically, the ring-down time τ can be well below 10 ps. Specialized cavity structures can be used to switch faster than this ring-down time limit. More details can be found in Yi Yu et al., Fano resonance control in a photonic crystal structure and its application to ultrafast switching, *Applied Physics Letters* vol. 105, 061117 (2016)., which is hereby incorporated herein by reference in its entirety for all purposes.

In general, a larger quality factor can lead to a larger S/N ratio. In practice, the quality factor of the resonator 110 can be substantially equal to or greater than $10^3$ (e.g., about $10^3$, about $10^4$, about $10^5$, about $10^6$, about $10^7$, or greater, including any values and sub ranges in between). The quality factor of the resonator 110 can also affect the number of probe photons 115 released by the resonator 110 upon absorption of one signal photon 125. This number of probe photons 115 can be greater than 20 (e.g., greater than 20, greater than 50, greater than 100, greater than 200, greater than 500, greater than 1000, greater than 2000, or greater than 5000, including any values and sub ranges in between).

In one example, the atomic switch implemented by the absorber 120 is broad-band and incoherent, which allows for room temperature operation. For example, the absorber 120 can include a low bandgap semiconductor. The bandgap energy can be, for example, less than 2 V (e.g., less than 2 V, less than 1.8 V, less than 1.6 V, less than 1.4 V, less than 1.2 V, or less than 1 V, including any values and sub ranges in between). Semiconductor materials that can be used for the absorber 120 include, but not limited to, silicon, germanium, InP, GaAs, InSb, InAs, and GaSb, among others.

In some cases, the bandgap energy of the absorber 120 can be at least two times greater than the photon energy of the probe photons to reduce the probability of two-photon absorption in the resonator 110. Reduction of two-photon absorption can decrease dark count of the SPD 100. The ratio of the probe photon energy to the bandgap energy of the absorber 120 can be about 0.1 to 0.5 (e.g., about 0.1, about 0.2, about 0.3, about 0.4, or about 0.5, including any values and sub ranges in between).

In some cases, the absorber 120 can include a wide bandgap semiconductor, such as III-Nitrides (also referred to as III-V semiconductors). Wide bandgap III-N semiconductors can offer unique optical and electronic properties for constructing SPDs based on optical avalanche. For example, III-Nitride semiconductors can provide tunable absorption (and emission) covering a wide range from the ultraviolet (UV) to near infrared (IR) spectral region. Accordingly, SPDs including wide bandgap III-N can detect signal photos 125 from UV to near IR.

In addition, the material quality of III-Nitrides are also high due to the availability of bulk GaN substrates with low-dislocation density. In contrast with III-V compounds, which usually have a zinc-blende (3-cubic) structure, III-Ns can crystallize either in the zinc-blende or the wurtzite (2-hexagonal) phase. The wurtzite phase is non-centrosymmetric, which induces polarization effects. These polarization effects allow new degrees of freedom to control excitons in these semiconductors. For example, the absorber 120 can include a quantum well (QW) made of wide bandgap III-N material and the resonator 100 can include another semiconductor material (e.g., silicon) (see, e.g., FIG. 6). The discontinuity of the polarization at the interface between the two semiconductors can result in a charge density. The two interfaces formed by the barrier-well materials are oppositely charged resulting in an internal electric field, which causes bending of the conduction and valence bands (also referred to as quantum-confined Stark effect). The free carrier dispersion of wurtzite-GaN is close to that of Si around 1550 nm, suggesting that a similar sensitivity performance can be expected.

In some cases, the absorber 120 includes a semiconductor heterostructure. For example, the absorber 120 can include a first semiconductor layer having a first bandgap. The first semiconductor layer is sandwiched between two side layers, which include a semiconductor having a second bandgap greater than the first bandgap of the first semiconductor layer.

The detector 130 can include an off-the-shelf PIN photodetector. The bandwidth of the detector 130 can be substantially equal to or greater than 1 GHz (e.g., about 1 GHz, about 2 GHz, about 5 GHz, about 10 GHz, about 20 GHz, about 30 GHz, about 40 GHz, about 50 GHz, about 60 GHz or greater, including any values and sub ranges in between).

Single Photon Detectors Using Single-Sided Resonators

FIG. 2 shows a schematic of an SPD 200 including a single-sided resonator 210. The resonator 210 includes a first reflector 212a and a second reflector 212b. The first reflector 212a is partially transmissive to probe photons as the probe wavelength. As a result, the first reflector 212a is also used as an input/output coupler to receive and deliver probe photons 215. The reflectance of the first reflector 212a at the probe wavelength can be substantially equal to or less than 99.5% (e.g., less than 99.5%, less than 99.2%, less than 99%, less than 98%, less than 97%, less than 96%, or less than 95%, including any values and sub ranges in between). The second reflector 212b is highly reflective at the probe wavelength to achieve a high quality factor. The reflectance of the second reflector 212b at the probe wavelength can be substantially equal to or greater than 99.5% (e.g., greater than 99.5%, greater than 99.6%, greater than 99.7%, greater than 99.8%, greater than 99.9%, greater than 99.95%, including any values and sub ranges in between).

The SPD 200 includes an absorber 220 disposed in the space between the two reflectors 212a and 212b. The absorber 220 includes a semiconductor material having a conduction band and a valence band, shown in the diagram 205. Absorption of a signal photon (not shown in FIG. 2) causes at least one electron to be excited from the valence band to the conduction band. This atomic excitation, in turn, leads to a free-carrier dispersion effect that can change the refractive index of the absorber 220 and accordingly the refractive index experienced by probe photons 215 in the resonator 210. As described above, this change of refractive index can disturb the resonant condition of the resonator 210, causing the resonator 210 to release more probe photons 215. A detector 230 is used to pick up these probe photons 215 to detect the absorption of the signal photon.

The absorption of the signal photon can also change the phase of the probe photons 215 detected by the detector 230. Since the first reflector 212a is partially transmissive to the probe photons 215, even in the absence of the signal photon, the detector 230 may still detect some probe photons 215. The absorption of the signal photon changes the refractive index experienced by the probe photons 215 and therefore changes the optical path length travelled by the probe photons 215. For example, increasing the refractive index can increase the optical path length of the probe photons 215. Accordingly, probe photons 215 arrive at the detector 230 with a time delay and generate a positive phase change $\Delta \varphi$ in the detected signal. In contrast, decreasing the refractive index can also decrease the optical path length of the probe photons 215. Accordingly, probe photons 215 arrive at the detector 230 earlier compared to the situation without the signal photon and generate a negative phase change $-\Delta \varphi$ in the detected signal. This phase change can be measured using homodyne or heterodyne detection (see, e.g., FIGS. 3A-3B) to determine the presence or absence of the signal photon.

Single Photon Detectors Using Ring Resonators

Figure 3A:
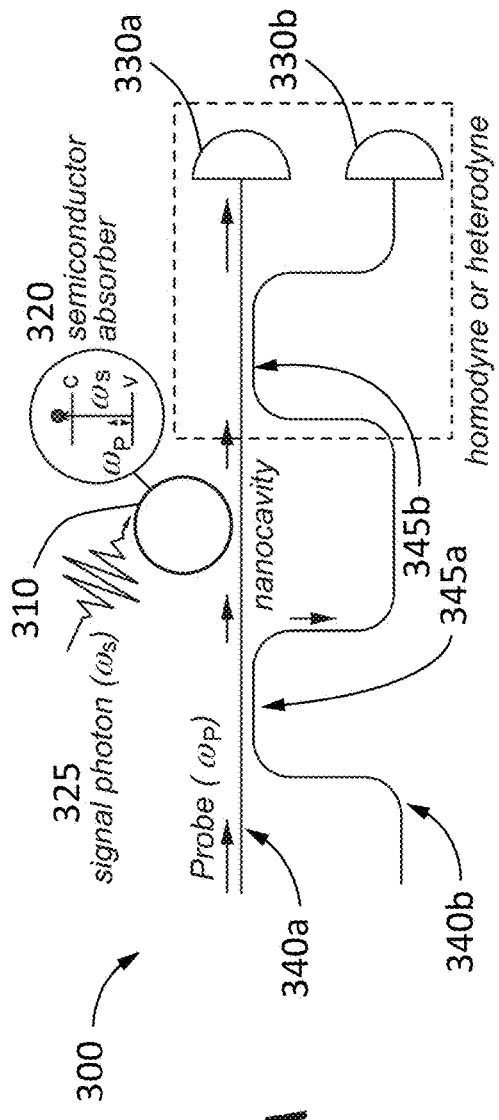
FIG. 3A shows a schematic of a photodetector including a ring resonator before absorption of a signal photon.
Figure 3B:
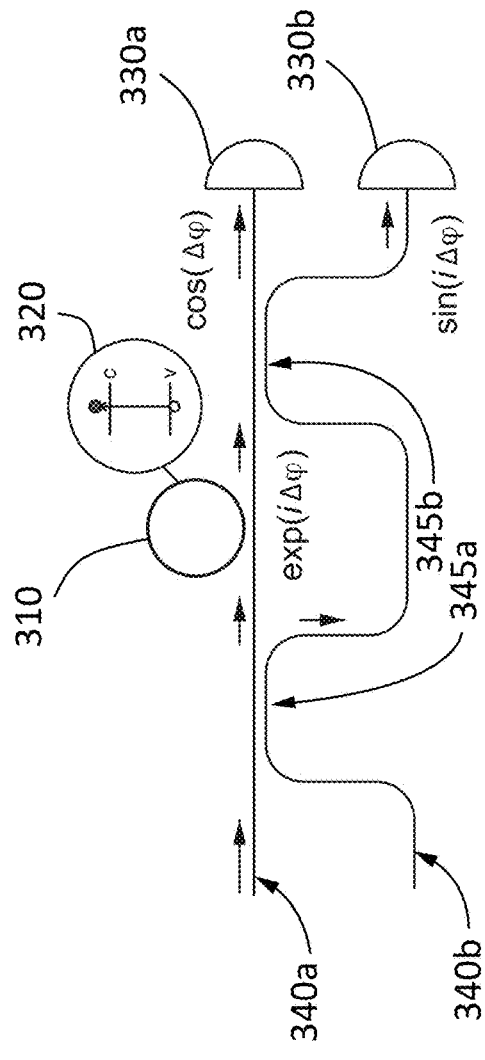
FIG. 3B shows a schematic of the photodetector shown in FIG. 3A upon absorption of the signal photon.

FIGS. 3A-3B show a schematic of an SPD 300 including a ring resonator 310 to store probe photons. FIG. 3A shows the SPD 300 before absorption of a signal photon 325 and FIG. 3B shows the SPD upon absorption of the signal photon. The ring resonator 300 includes a semiconductor absorber 320 to absorb the signal photon 325. An input waveguide 340a is evanescently coupled to the ring resonator 310 to deliver probe photons into the ring resonator 310. A reference waveguide 340b is evanescently coupled to the input waveguide 340a at two junctions 345a and 345b. The reference waveguide 340b can be coupled to a local oscillator to guide reference photons. A first detector 330a is coupled to the input waveguide 340a, and a second detector 330b is coupled to the reference waveguide 340b.

The absorption process of the signal photon 325 can be ultrafast, with the time-scale on the order of sub-picoseconds (e.g., less than 1 ps). The detection medium (i.e. the ring resonator 310) is continuously interrogated by the probe photons through the ring resonator 310, which shifts the resonant wavelength in response to the absorbed signal photon 325. The resulting phase change $\Delta \varphi$ and amplitude change of the transmitted probe photons 325 are detected using homodyne or heterodyne methods with high-speed p-i-n photodetectors 330a and 330b, which do not need to be single-photon resolving. The cavity-based readout produces all-optical gain: the absorbed signal photon produces a cavity shift that is converted into a many-photon signal change on the p-i-n detector.

In one example, due to the evanescent coupling of the two waveguides 340a and 340b at the two junctions 345a and 345b, probe photons can propagate from the input waveguide 340a into the reference waveguide 340b, and reference photons can also propagate from the reference waveguide 340b into the input waveguide 340a. As a result, the probe photons and the reference photons interfere with each other upon arrival at the detectors 330a and 330b. In the absence of the signal photon 325, the probe photons and the reference photons can constructively interfere at the first detector 330a and destructively interfere at the second detector 330b. As a result, the first detector 330a can detect some signal but the second detector 330b detects no signal.

Upon absorption of the signal photon 325, the optical path length of the ring resonator 310 changes (e.g., due to the free carrier dispersion effect). Therefore, the interference at the second detector 330b is no longer destructive and some signal is detected by the second detector 330b. The change of the optical path length of the ring resonator 310 can also change the phase of the signal detected by the detectors 330a and 330b. This phase and amplitude change of the signal detected by the second detector 330b can be used to determine the presence of the signal photon 325.

The above optical avalanche process is ultrafast and is not limited by an electrical amplifier's RC time, the drift time of carriers, or the bandwidth of RF lines. Instead, the optical readout bandwidth depends on the cavity-to-waveguide coupling rate, which can be above THz. A full cavity shift is not necessary as long as the probe field is strong enough to achieve a sufficient signal-to-noise (S/N). The probe photons can be multiplexed and transmitted nearly losslessly over long distance in waveguides (i.e., input waveguide 340a and/or reference waveguide 340b). Probe sampling can be carried out with existing sub-ps single-shot methods, including in photonic integrated circuit (PIC) architectures. Large photodetector arrays are also possible using waveguides on PICs to distribute and sample the probe fields.

In one example, the absorber 320 can be part of the ring resonator 310 (e.g., the absorber 320 forms an arc that is part of the ring resonator 310). In another example, the semiconductor material of the absorber 320 can also be the material that forms the ring resonator 310. In yet another example, the absorber 320 can form a low bandgap quantum well embedded in the ring resonator 310.

In one example, the reference photons and the probe photons have the same wavelength and the two detectors 330a and 330b perform homodyne detection. In another example, the reference photons and the probe photons have different wavelengths and the two detectors 330a and 330b perform heterodyne detection. The wavelengths of the reference photons and the probe photons can be long enough so that they are not absorbed by the absorber 320.

In one example, the absorption of the signal photon 325 can be achieved via the resonant mode (also referred to cavity mode) of the ring resonator 310. In this case, the signal photon 325 can also be resonant with the ring cavity 310, but the resonant mode of the signal photons 325 can be different from the resonant mode of the probe photons. For example, the probe photons can resonate with the first order mode of the ring resonator 310 and the signal photon can resonate with the second order mode of the ring resonator 310. In another example, the absorption of the signal photon 325 can be achieved via material absorption. In this case, the photon energy of the signal photon 325 can be greater than the bandgap of the absorber 320. In yet another example, the absorption of the signal photon 325 can be achieved via both resonant mode and material absorption.

Single Photon Detectors Using Dynamic Cavity Switch Mechanism

FIGS. 4A-4B show a schematic of an SPD 400 including a dynamic cavity switch mechanism to increase the S/N ratio at a given probe field input power. FIG. 4A shows the SPD 400 before absorption of a signal photon 425 and FIG. 4B shows the SPD 400 after absorption of the signal photon 425. The SPD 400 includes a ring resonator 410 evanescently coupled to an input waveguide 440a at two points 412a and 412b. At the first point 412a, the input waveguide 440a can couple a first portion of probe photons out of the ring resonator 410. At the second point 412b, the input waveguide 440a can couple a second portion of the probe photons out of the ring resonator 410. The section of the input waveguide 440a between the two points 412a and 412b can have a first length $L_1$ and the section of the ring resonator 410 between the two points 412a and 412b can have a second length $L_2$. The difference between the first length and the second length can be an integer multiple of the probe wavelength plus half of the probe wavelength, i.e., $L_1 - L_2 = m\lambda + \frac{1}{2}\lambda$, where m is an integer. In this case, the first portion of the probe photons destructively interfere with the second portion of the probe photons in the absence of any signal photon.

The SPD 400 also includes a reference waveguide 440b evanescently coupled to the input waveguide 440a at two junctions 445a and 445b. The reference waveguide 440b can be coupled to a local oscillator to guide reference photons. A first detector 430a is coupled to the input waveguide 440a, and a second detector 430b is coupled to the reference waveguide 440b.

In the absence of any signal photon, the ring resonator 410 is in a high-Q state (i.e. on resonance with the probe photons) and the transmissions of the ring resonator 410 at the two points 412a and 412b cancel each other due to destructive interference. Upon the dispersive cavity shift following the absorption of the signal photon 425, the output field no longer cancels, causing the release of a strong probe pulse. The released "avalanche" of optical energy can be extremely fast (e.g., less than 1 ps) and can be detected by the two detectors 430a and 430b. Moreover, the intensity of the probe field change can also be calibrated to the number of signal photons 425 absorbed to enable photon-number resolution.

Broadband Single Photon Detectors

The effect of free carrier dispersion in a semiconductor is usually a broadband effect since signal photons with photon energy larger than the bandgap can be absorbed by the semiconductor. This absorption is also incoherent, but it is still much stronger than parametric nonlinearities such as the Kerr nonlinearity. Even the small change in the refractive index caused by the addition of a single electron-hole pair can be detectable inside an optical resonator with an ultra-long lifetime and small mode volume. Without being bound by any particular theory or mode of operation, the mode volume V of a resonator measures the volume occupied by the optical mode supported by the resonator. Generally, a mode volume represents strong spatial confinement of optical fields.

As discussed above, the optical avalanche approach uses a probe field at a carrier wavelength below the semiconductor bandgap of an absorber to detect the small resonance shift $\Delta\omega$ of the cavity caused by the index change $\Delta n$. The performance of a detector based on an optical avalanche process can be estimated by the following calculation:

$$\Delta\omega/\omega \approx -\Delta n/n \Rightarrow \Delta\omega/\Gamma \approx -Q\Delta n/n \approx -Q/n \sigma (\Delta N \text{ cm}^3)^{0.84} \quad (2)$$

where $\Gamma$ is the cavity linewidth, $\sigma$ the free-carrier dispersion coefficient (e.g., $1.53 \times 10^{-18}$ for Si), $\Delta N = \#/V$ the change in hole concentration, # is the number of photogenerated electron-hole pairs, and V the effective cavity mode volume.

Figure 5A:
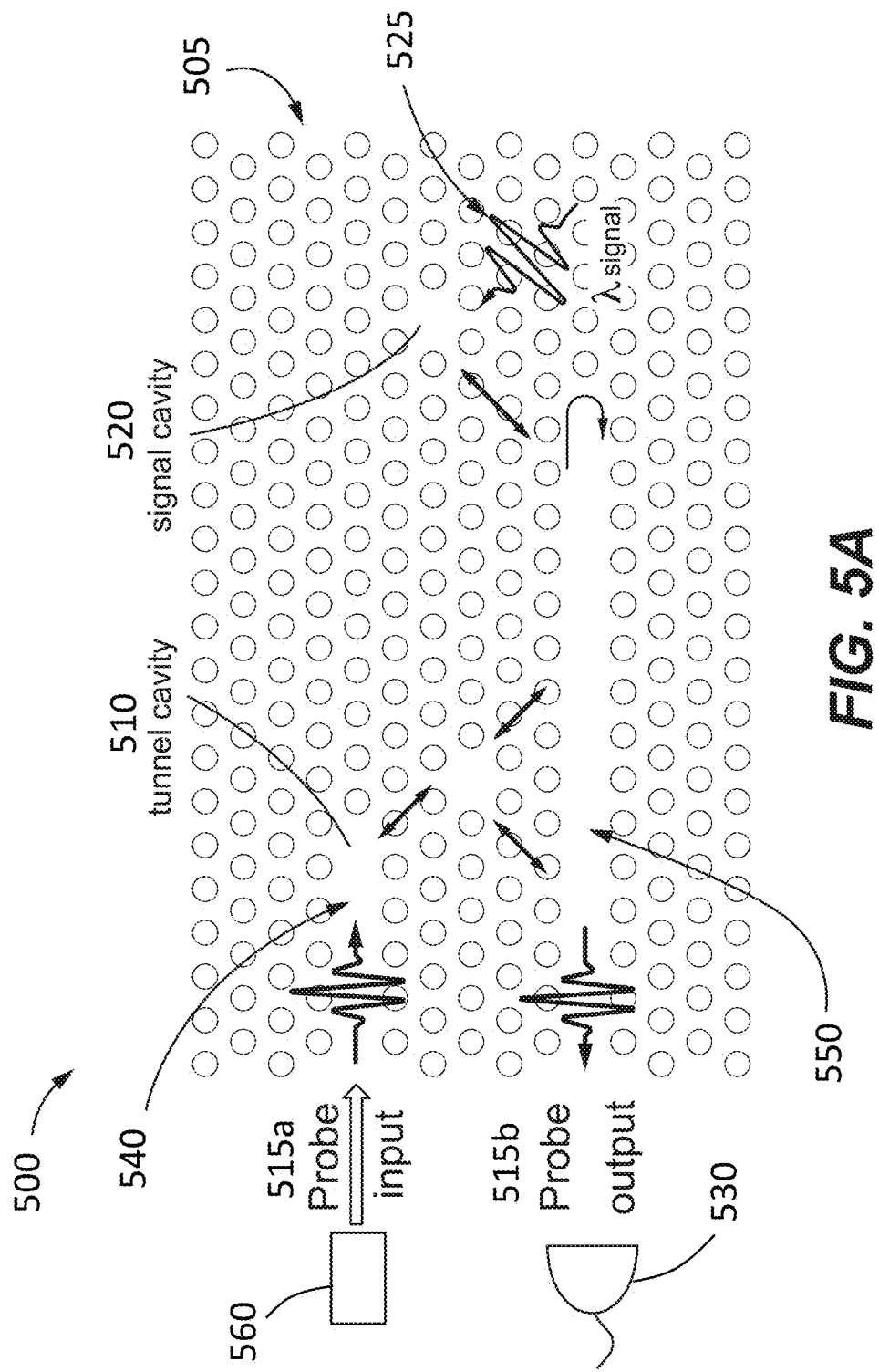
FIG. 5A shows a top view of a photodetector implemented on a photonic crystal membrane fabricated on a silicon-on-insulator (SOI) platform.

For example, consider absorption of a single photon (#=1) in a Si photonic crystal (PhC) nanocavity (see, e.g., FIG. 5A). For a probe wavelength at 1550 nm and V~0.1·$(\lambda/n)^3 = 1.4 \cdot 10^{-14}$ cm$^3$, a fractional cavity frequency shift of $\Delta\omega/\Gamma \approx 2 \cdot 10^{-7}$ Q can be obtained. As discussed below, it can be desirable for $\Delta\omega$ to be only a fraction of $\Gamma$ to realize number resolution of the detector. According to Equation (2), the quality factor Q can be on the order of $10^6$, which is achievable with current state-of-art fabrication techniques that which has demonstrated intrinsic Qs of ~$10^7$ in PhC cavities with ~$(\lambda/n)^3$ mode volume.

FIG. 5A shows a top view of an SPD 500 implemented on a photonic crystal membrane using a silicon-on-insulator (SOI) material platform. The SPD 500 includes a photonic crystal 505, which can be formed by an array of holes formed on or in a substrate. Alternatively, the photonic crystal 505 can be formed by an array of cylinders deposited on a substrate. The photonic crystal 505 includes an input waveguide 540 defined by a line defect (i.e., missing holes or cylinders along a line) and an output waveguide 550 defined by another line defect. The photonic crystal 505 also includes a tunnel cavity 510 defined by a point defect (i.e., one missing hole or one cylinder) and a signal cavity defined by another point defect. A probe laser 560 is employed to provide input probe photons 515a and a detector 530 is employed to detect output probe photons 515b. In some cases, the material of the photonic crystal 505 can be AlGaN, which has a large bandgap of about 6.2 eV to reduce the probability of multi-photon absorption of the probe photons 515. The probe photon energy can be about 0.7 eV in the telecom band. The SPD 500 includes an absorber, such as a quantum well (QW), which is positioned precisely at a node of the probe field. The QW can have a band alignment (e.g., type II heterojunction) such that the photo-generated hole can diffuse into the high-bandgap region and thus interact with the cavity probe field.

Figure 5B:
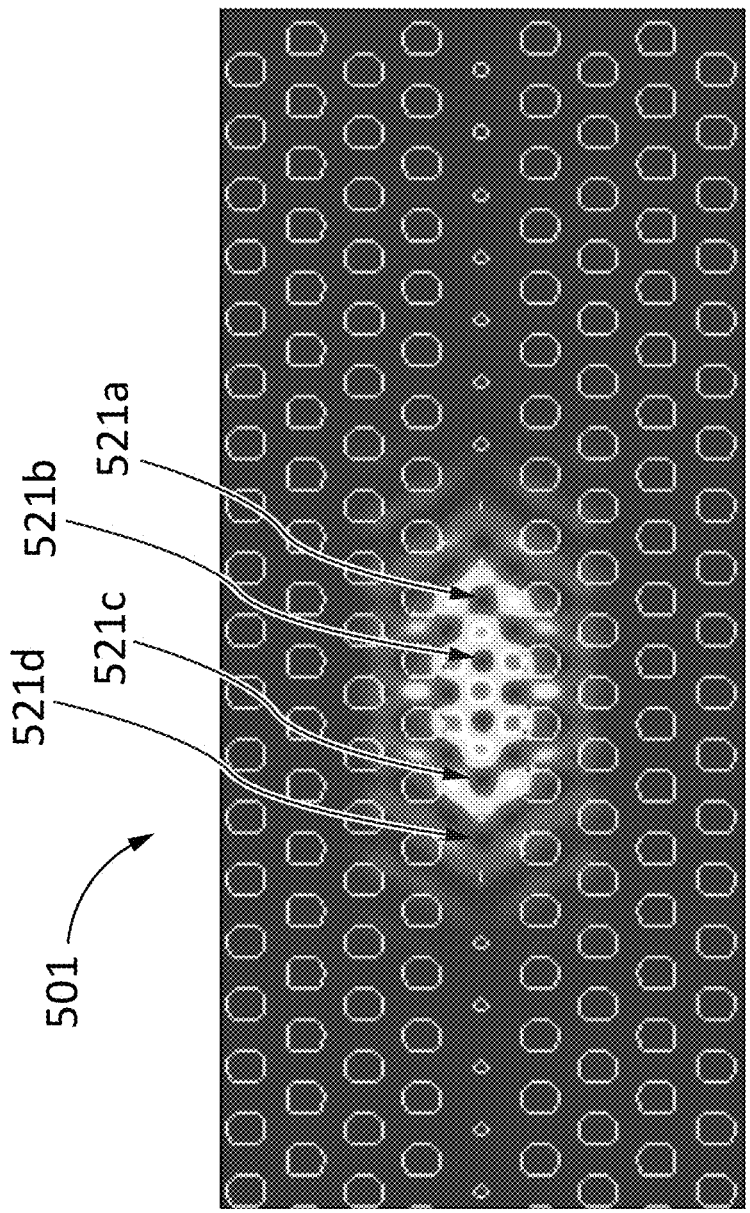
FIG. 5B shows a calculated optical field distribution of probe photons in a photonic crystal resonator that can be used in the photodetector shown in FIG. 5A.

FIG. 5B shows calculated probe field distribution in a photonic crystal resonator 501 that can be used in the photodetector 500 shown in FIG. 5A. The probe field, which can be defined as the amplitude of the electrical field, includes multiple nodes 521a, 521b, 521c, and 521d (four nodes are labelled for illustrative purposes). The probe field at these nodes is at a local minimum. The absorber can be placed at these nodes so as to reduce the probability that the absorber absorbs probe photons.

In operation, the probe laser 560 provides input probe photons 515a that are coupled into the photonic crystal 505 via the input waveguide 540. The input probe photons 515a are guided through the tunnel cavity 510 into a waveguide terminated on the right by the signal cavity 520. The output probe photons 515b are produced by the interference between the left-propagating probe field leaking out of the tunnel cavity 510 and the reflected part of the right propagating field (i.e., reflected by the signal cavity 520). The resonances of the two cavities 510 and 520 can lie within a linewidth of the signal cavity 520, i.e., $|\omega_{sig} - \omega_T| \sim \Gamma_{sig}$, where $\omega_{sig}$ is the resonant frequency of the signal cavity 520, $\omega_T$ is the resonant frequency of the tunnel cavity 510, and $\Gamma_{sig}$ is the linewidth of the signal cavity 520. In this case, the round-trip phase of the right-propagating field is very sensitive to shifts of the signal resonance. By adjusting the distance between the cavities 510 and 520, the round-trip phase can be set to cause destructive interference at the probe output in the absence of any signal photon 525.

The absorption of the signal photon 525 promotes a single electron into the conduction band, which in turn causes a dispersive frequency shift on the probe field that disrupts the destructive interference condition, i.e., light can now leak from the probe output waveguide. The signal photon thereby triggers an avalanche of probe photons 515 stored in the system to propagate down the output waveguide 550, where it can be detected using the detector 530, such as a shot-noise limited classical detection system.

The dimensions of the photonic crystal 505 can be on the order of microns. For example, the length of the photonic crystal 505 can be about 1 µm to about 1 mm (e.g., about 1 µm, about 2 µm, about 5 µm, about 10 µm, about 20 µm, about 50 µm, about 100 µm, about 200 µm, about 500 µm, or about 1 mm, including any values and sub ranges in between). In this case, multiple photonic crystals 505 can be arrayed together to form a detector array.

Figure 6:
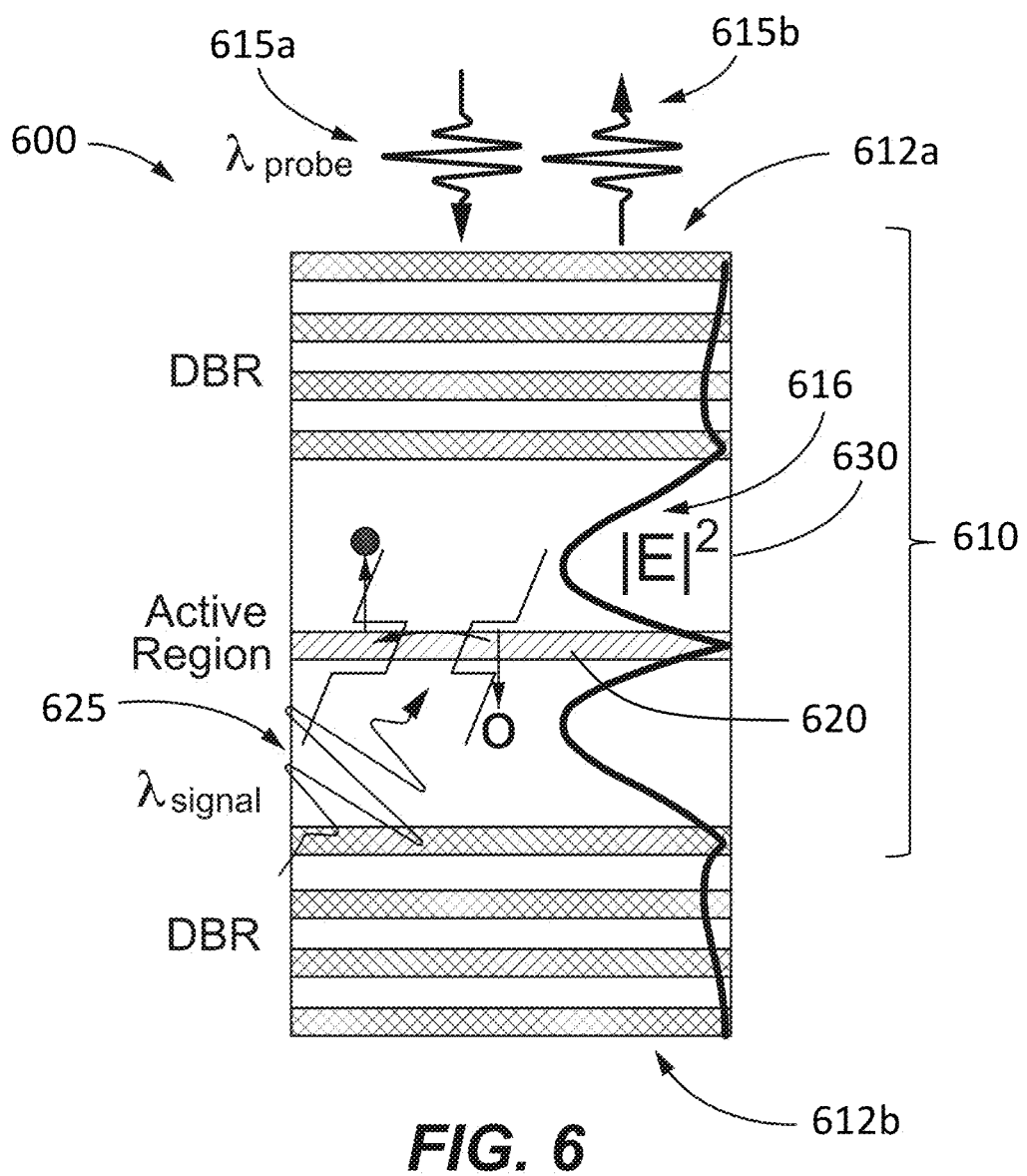
FIG. 6 shows a side view of a photodetector including a resonator defined by two distributed Bragg reflectors (DBRs).

FIG. 6 shows a side view of an SPD 500 including a resonator 610 defined by two distributed Bragg reflectors (DBRs) 612a and 612b, which are fabricated on or in a substrate 630. The first DBR 612a can be partially transmissive at the probe wavelength to couple input probe photons 615a into the resonator 610. The input probe photons 615a form a probe field 616 in the resonator 610. The probe field 616 can be defined as $|E|^2$, where E is the electrical field of the probe field 616. An active region 620 is disposed between the two DBRs 612a and 612b to function as an absorber. The active region 620 can include a quantum well (QW) structure in a very large bandgap semiconductor and can be placed at the node of the probe field 616. This can reduce the probability of absorption of input probe photons 615a by the active region 630. In the absence of any signal photon 625, the input probe photons 615a are in resonance with the resonator 610. Absorption of the signal photon 625 can disturb this resonance and cause the resonator 610 to release output probe photons 615b, which can be collected by a detector (not shown in FIG. 6) to indicate the presence of the signal photon 625.

Characterizations of Broadband Single Photon Photodetectors

Timing Jitter

The temporal width of the probe pulse formed by the release of probe photons (e.g., 115 in FIG. 1B) can affect the timing jitter, provided that the response time of the classical detector is short enough to resolve it. For the SPD 500 shown in FIG. 5A, this pulse width can be determined by the coupling rate between the tunnel cavity 510 and the output waveguide 550 as well as the round trip time between the cavities 510 and 520. Even for an ultra-long lifetime (ultra-high Q) signal cavity 520, the interference condition can still be modified on a much shorter time scale given by the round-trip time, allowing THz bandwidth frequency modulation. In this ultra-high speed operation regime, a constructive interference condition could be set to allow a constant flow of optical power from the output waveguide 550. The absorption of the signal photon 525 causes a frequency modulation of the output field with sub-ps timing resolution determined by the round-trip time. Conversion to intensity modulation can be achieved using an on-chip interferometer. Alternatively, coherent detection measures both quadratures of the output field allowing access to the timing information.

An alternative is to use the waveguide between the cavities 510 and 520 as an optical buffer since a substantial field can build up there if the tunnel cavity 510 is asymmetric and preferentially couples to the right. This waveguide field can also be flushed out during the round-trip time when the interference condition changes. Even in a regime where the output field is formed by probe photons 515a decaying into the output waveguide 550 from the tunnel cavity 510, this decay time can be on the order of picoseconds for a coupling Q of about 1000.

Dark Counts

Thermal fluctuations in the intrinsic density of carriers can be estimated by considering that the average number of free carriers in the active volume (e.g., 630 in FIG. 6) is $n_i \cdot V$, where $n_i$ is the intrinsic carrier density and V is the volume of the active volume. A carrier generated by absorption of the signal photon can spend an average time τ in the active volume before it is removed by either drift, diffusion, radiative, or non-radiative recombination. The dark count rate from this effect is therefore around ni·V/τ. Since the reset time is also be given by τ, there can be a trade-off between the dark count rate and the maximum count rate. Reducing $n_i$ and V therefore can be desirable to maintain both a low dark count rate and large detection count rate.

Another source of dark counts is temperature-induced changes to the refractive index, especially when this change is comparable to the refractive index change induced from a single excited electron. For example, a Si cavity with mode volume $V \sim 0.1 \cdot (\lambda/n)^3$ can have $\Delta n \sim 6 \times 10^{-7}$, which is equal to $dn/dT \Delta T$. In this case, $\Delta T$ can be estimated to be about $3 \times 10^{-3}$ K, where $dn/dT = 1.86 \times 10^{-4}$ K$^{-1}$ for Si. This can pose a challenge to the temperature stability of the structure. This concern can be addressed by, for example, materials with dn/dT of the opposite sign and active feedback control using heaters.

An alternative approach to frequency stabilization of the device is to use an integrated external cavity laser, where the structure in FIG. 5A constitutes the external cavity. This configuration can lock the laser oscillation frequency to the resonance of the external cavity and automatically stabilize frequency. Another advantage of this approach is that the optical power reflected back into the probe input waveguide 540 can be recycled by the laser 560 making the structure extremely energy efficient.

Any accidental generation of a free carrier in the active region by nonlinear-absorption of the probe beam or thermal excitation can also lead to dark counts. This concern can be reduced by, for example, using probe photons with a photon energy smaller than half of the semiconductor bandgap energy of the absorber so as to reduce two-photon absorption (TPA). However, with the large Q/V ratio in reaching single photon sensitivity, three-photon absorption may be non-negligible. Without being bound by any particular theory or mode of operation, three-photon absorption can be estimated by:

$$\gamma_3 = \alpha_3 I^2 c/n \qquad (3)$$

where $\alpha_3$ is the three photon absorption coefficient (e.g., about 0.02 cm$^3$/GW$^2$ for Si at $\lambda=2.3$ µm) and I is the intra-cavity intensity estimated by I~Uc/2 nV, where U is the intra-cavity optical energy $U = n_p h\nu$, $n_p$ is the number of photons in the cavity, and c is the speed of light. For a rate of $\gamma_3$ of about 1/s, this results in a cavity photon number of $n_p \sim 2$, which corresponds to a significantly smaller probe output power than that required for a sufficient SNR at the classical detector.

Several methods can be used to further reduce dark counts. First, using probe photons at longer probe wavelengths can decrease multi-photon absorption. For example, three-photon absorption usually disappears around 3.3 µm. Therefore, the probe wavelength can be longer than 3.3 µm to reduce or eliminate eliminate three-photon absorption. Second, the Kerr-nonlinearity (e.g., in silicon) can be used for frequency conversion to convert the probe photons to the telecom band (e.g., at about 0.7 eV).

In a third approach, a III-nitride based detector device architecture can be used. In this approach, shown in FIG. 6, the active region 630 includes a semiconductor heterostructure or a low-band gap semiconductor while the bulk of the cavity is made of a wide-bandgap III-nitride semiconductor. The point is to induce the diffusion of the carriers generated by the signal photons into the wide-bandgap region to overlap with the probe field. Generally, more overlapping can lead to a more significant change to the refractive index experienced by the probe field. The resulting index change at the probe wavelength due to free carrier dispersion changes the resonant frequency.

To facilitate transporting the photo-generated carrier pair into the probe field region, polarization induced tunnel junctions can be used. In wide bandgap semiconductors, the tunneling probability can be low owing to the high barrier heights along with dopant solubility limits. Nevertheless, taking advantage of the internal electric field present in polar heterostructures, efficient interband tunneling can be achieved.

Figure 7:
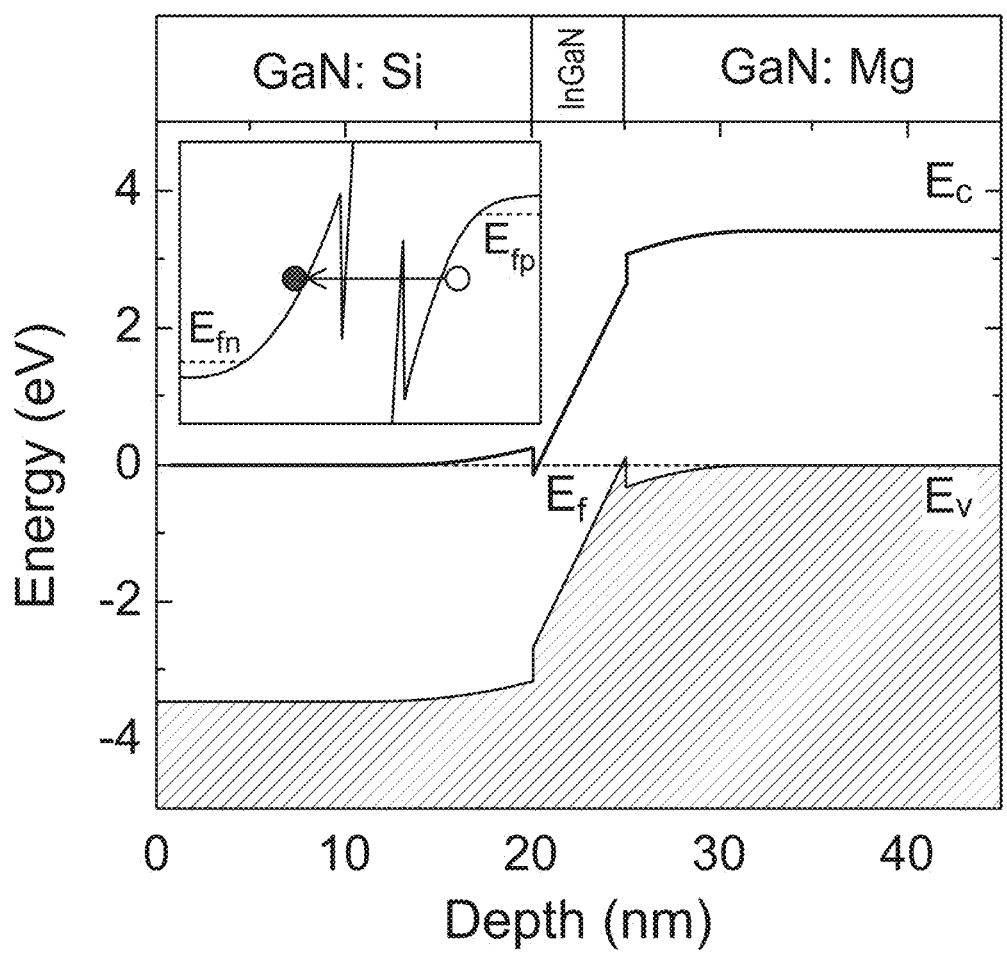
FIG. 7 shows a band diagram at equilibrium of a GaN/InGaN/GaN tunnel junction that can be used as an absorber in the photodetectors shown in FIGS. 1A-6.

FIG. 7 shows a band diagram at equilibrium of a GaN/InGaN/GaN tunnel junction. The In composition and thickness of the InGaN barrier provides a convenient polarization-induced band bending that aligns the conduction and valence bands. In the inset of FIG. 7 showing the band diagram under reverse bias, it can observed that the electrons in the valence band of p-type GaN (GaN:Mg) tunnel across the p-depletion region, the InGaN layer, the n-depletion region, and finally enter the conduction band of n-type GaN (GaN:Si). Based on this principle, different heterostructures can be considered taking into account the growth and doping limitations of III-Ns. These structures can include, for example, $Al_{0.3}Ga_{0.7}N/GaN/Al_{0.05}Ga_{0.95}N$, where the low Al content layer acts as electron blocking barrier.

Maximum Count Rate

Limitations on the maximum count rate stemming from the structure in FIG. 5A include the coupling rate between the input waveguide 540 and tunnel cavity 510 and the relaxation rate of carriers in the active volume of the signal cavity 520. A small coupling rate into the tunnel cavity can reduce the amount of continuous wave (CW) power in the input probe field, but can also increase the time to refill the cavity with probe photons 515a. As discussed above, a long lifetime of unwanted carriers in the active volume can reduce the dark count rate, but at the same time can also limit the reset time. To reach dark counts on the order of 1/s and GHz count rate, it might therefore be desirable to actively reset the device after a detection event by, for example, applying a bias electric field to sweep out any residual charge carriers.

Detector Bandwidth

The bandwidth of the detector can be determined by the absorption spectrum of the active material. For Si and the III-Nitride QWs, the absorption spectrum can cover UV, visible, and near-IR regions.

Efficiency

The detection efficiency is usually set in part by the probability of an incoming signal photon being absorbed in the active region. A higher probability of absorption leads to a higher detection efficiency. In addition, the detection efficiency is also affected by the probability for the index change induced by the electron-hole pair to cause an avalanche of probe photons from the resonator. This probability can be increased by focusing the signal photons to the absorber using, for example, lenses, broadband metasurfaces, or broadband antennas.

Photon Number Resolution

The resonance shift of the resonator due to free carrier dispersion is typically proportional to the number of generated electron-hole pairs and therefore to the number of signal photons. The steady state probe output power is usually shifted between its minimum and maximum values when the signal cavity resonance shifts by one linewidth, $\Gamma_{sig}$. The power spectrum resembles a Fano resonance, which enables a larger sensitivity to frequency shifts compared to a Lorentzian-like resonance. The photon number resolution can be given by $\Gamma_{sig}/\Delta\omega_{sig}$, where $\Delta\omega_{sig}$ is the frequency shift from a single photon. As the output power is proportional to the number of probe photons in the tunnel cavity, $UT/h\nu_{probe}$, the probe power can be large as long as multi-photon absorption is sufficiently weak.

Operating Temperature

The operating temperature can be determined by the dark counts caused by thermally excited carriers from defect states, as discussed above. Intrinsic Si has a carrier density $n_i$ of about $10^{10}$ cm$^{-3}$. The contribution to the dark counts can be made smaller by using a small volume of active volume. By the law of mass action, the intrinsic carrier density decreases exponentially with bandgap and temperature, $n_i \propto \exp(-E_{bg}/2\ kT)$ (and with electron/hole effective masses). For AlGaN or 4-H SiC that is also compatible with AlGaN growth, a density ni much less than 1/cm$^3$ can be possible.

Array Size

The SOI platform benefits from all the technological advancements in fabrication processes developed for the electronic industry. Integrating optical structures with electronic control circuitry makes it a suitable candidate for scaling a single unit cell device into large arrays.

Figure 8:
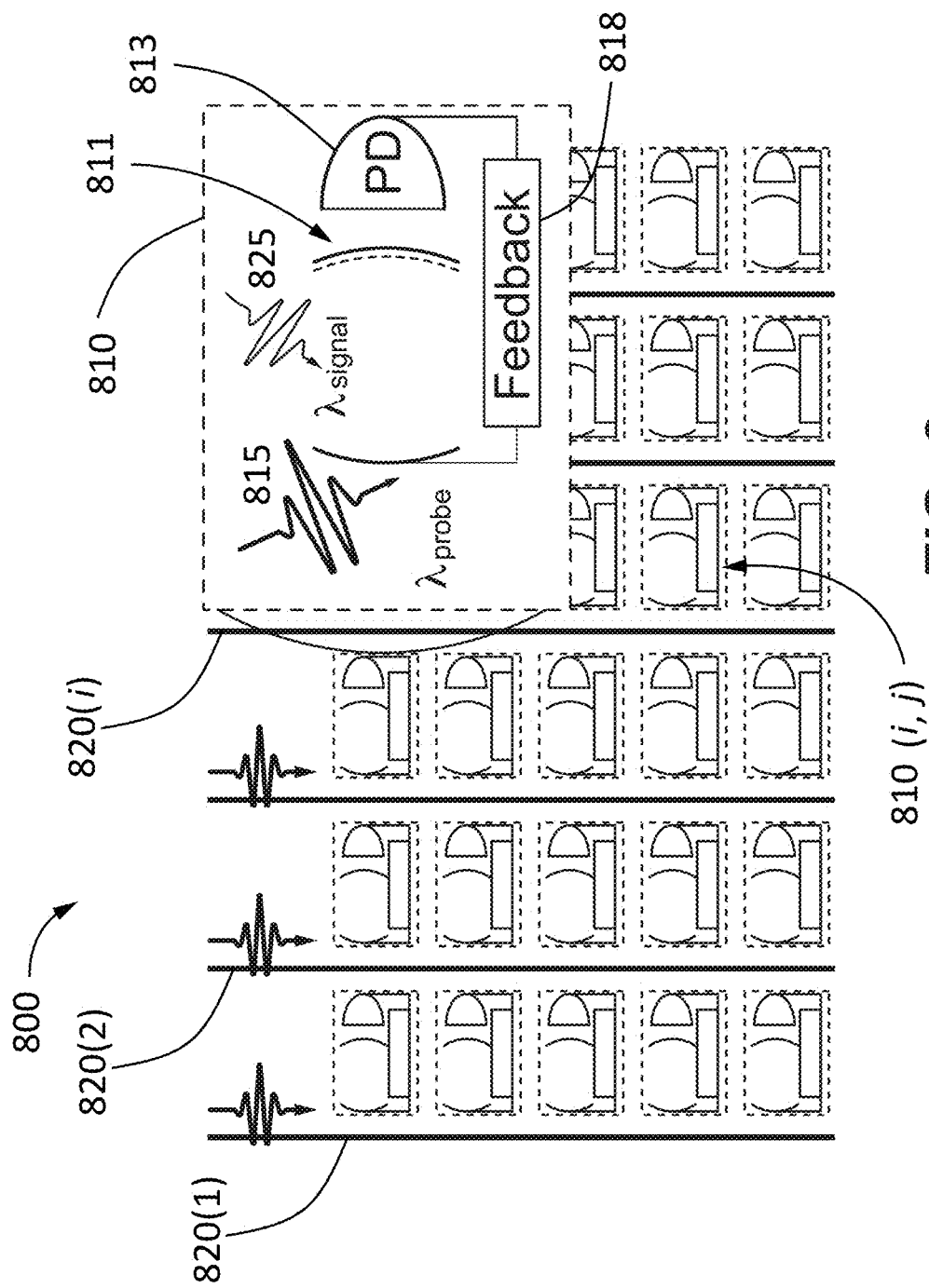
FIG. 8 shows a schematic of a detector array formed of many single photon detectors.

FIG. 8 shows a schematic of a detector array 800 based on the all-optical avalanche approach described above. The detector array 800 includes an array of unit detector cells 810 (i, j), where i and j are positive integer numbers, to detect signal photons 825. For each column of detector cells 810(i), a corresponding bus waveguide 820(i) is employed to provide probe photons 815. Each detector cell 810, as shown in the inlet, includes a resonator 811 optically coupled to a PD 813. A feedback loop 818 is coupled to the PD 813 and the resonator 811. The detector array 800 can also include one or more heaters for temperature stabilization.

In one example, the probe photons 815 for all the detector cells 810 can have the same wavelength. In another example, each column of detector cells 810(i) can use probe photons 815 having a distinct wavelength. This wavelength division multiplexed (WDM) readout signal can be de-multiplexed and detected externally, which can reduce the footprint of each individual cell. In a photonic crystal implementation, each cell can occupy an area on the order of about 100 μm$^2$, which means that an array of 10$^6$ detectors can occupy a footprint less than 100 mm$^2$.

Methods of Single Photon Detection Based on Optical Avalanche

Figure 9:
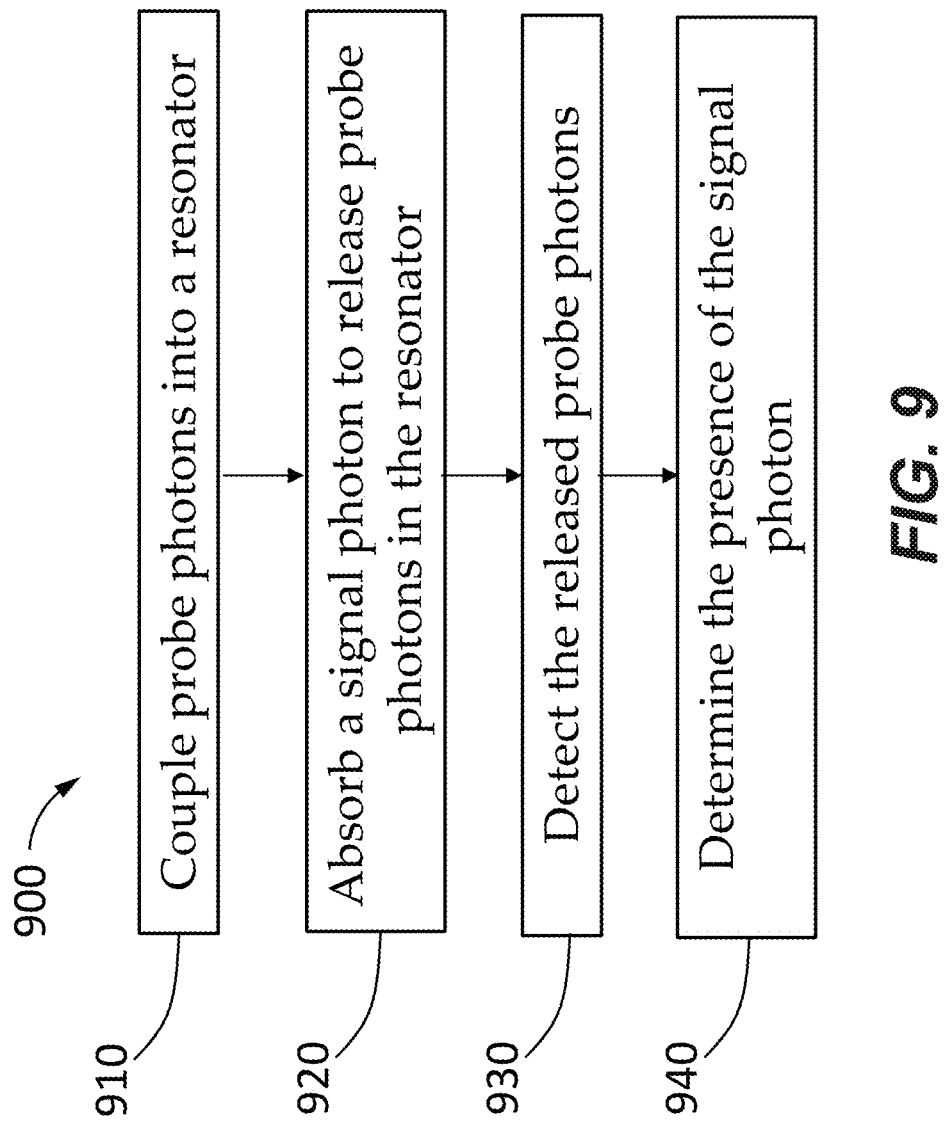
FIG. 9 illustrates a method of single photon detection based on optical avalanche.

FIG. 9 illustrates a method 900 of detecting a signal photo at a signal wavelength based on causing an optical avalanche. The method 900 includes, at step 910, coupling multiple probe photons at a probe wavelength (different from the signal wavelength) into a resonator. The resonator includes an absorber that is substantially transparent to the probe photons. In the absence of the signal photon, the resonator is on resonance with the probe photons so as to confined the probe photons within the resonator. The method 900 also includes absorbing the signal photon with the absorber at step 920. The absorber changes the resonant wavelength of the resonator in response to absorption of the signal photon, thereby releasing at least some of the probe photons from the resonator. At step 930, the released probe photons are detected. At step 940, the presence of the signal photon can be determined based on detection of the probe photons.

In one example, the resonator includes two distributed Bragg reflectors (DBRs). The probe photons can be coupled into the resonator by transmitting the probe photons via one of the DBRs (e.g., the first DBR). In this case, the first DBR can be partially transmissive to the probe photons. In addition, the absorber can be disposed between the two DBRs to absorb the signal photon. The absorber can include a semiconductor heterostructure, which further includes a central semiconductor layer sandwiched between two side semiconductors layers. The central semiconductor layer has a first bandgap and the two side semiconductor layers have a second bandgap greater than the first bandgap.

In another example, the resonator includes a photonic crystal. The photonic crystal includes a first line defect to define an input waveguide and a second line defect to define an output waveguide. The photonic crystal further includes a first point defect to define a tunnel cavity and a second point defect to define a signal cavity. In this case, the probe photons are transmitted through the input waveguide to enter a photonic waveguide defined by the two cavities. Probe photons released by the resonator are detected by a detector disposed near the output waveguide.

In yet another example, the resonator includes a ring resonator and the probe photons can be coupled into the ring resonator via an input waveguide evanescently coupled to the ring resonator. To increase the signal-to-noise (S/N) ratio, a dynamic cavity switching mechanism can be used. In this scheme, the input waveguide can include a first section and a second section. The first section is evanescently coupled to a first location of the ring resonator so as to couple out a first portion of probe photons, and the second section is evanescently coupled to a second location of the ring resonator so as to couple out a second portion of the probe photons. The second portion destructively interferes with the first portion.

In yet another example, the resonator includes a single-sided resonator including two reflectors. The probe photons can be coupled into the resonator via one reflector that has a reflectance less than 99.5% at the probe wavelength. The other reflector can have a second reflectance greater than 99.9% at the probe wavelength.

Applications of Single Photon Detectors

SPDs can benefit numerous technologies where precision photon timing at low light levels are desired. These technologies include passive and active imaging, microscopy, classical and quantum optical communications, atmospheric and space-based optical communications, Lidar, and time-of-flight ranging with sub-mm spatial resolution, among others.

The operation principle of the broad band detector corresponds to that of an all-optical transistor, where a strong optical field (the probe) is controlled by a weak field (the signal). In the limit of single photon sensitivity, this optical avalanche can have a major impact on linear optics quantum computing. A scalable quantum computer can be built from single photon sources, linear optical circuits, and single photon detectors. However, the quantum computer usually also uses so-called feed-forward, where detector measurement results are used to modify the state of the linear optical components. It is desirable for such modification to be carried out as photons are propagating through the circuit, making the feed-forward speed a useful performance metric. Since the optical avalanche approach described herein is based on the direct modulation of a switch by a single photon, it can implement feed-forward much faster without having to convert between the electronic and photonic domain.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising"

can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus for detecting a signal photon at a first wavelength, the apparatus comprising:
    a resonator to store a plurality of probe photons at a second wavelength different from the first wavelength;
    an absorber, disposed at least partially in the resonator and substantially transparent to the plurality of probe photons, to absorb the signal photon, absorption of the signal photon causing a change of a resonant wavelength of the resonator, the change of the resonant wavelength causing release of at least some of the plurality of probe photons from the resonator; and
    a detector, in optical communication with the resonator, to generate an electrical signal in response to detection of the at least some of the plurality of probe photons, the electrical signal indicating a presence of the signal photon.

2. The apparatus of claim 1, wherein the resonant wavelength of the resonator is substantially equal to or greater than 1.5 µm.

3. The apparatus of claim 1, wherein the resonator has a quality factor greater than $10^4$.

4. The apparatus of claim 1, wherein the resonator comprises a first distributed Bragg reflector (DBR) and a second DBR disposed opposite the first DBR.

5. The apparatus of claim 4, wherein the absorber comprises a semiconductor heterostructure disposed between the first DBR and the second DBR.

6. The apparatus of claim 4, wherein the absorber is disposed between the first DBR and the second DBR, the absorber comprising:
    a first semiconductor layer having a first bandgap;
    a second semiconductor layer disposed on a first side of the first semiconductor layer; and
    a third semiconductor layer disposed on a second side, opposite the first side, of the first semiconductor layer, the second semiconductor layer and the third semiconductor layer having a second bandgap greater than the first bandgap of the first semiconductor layer.

7. The apparatus of claim 6, wherein the first semiconductor layer comprises InGaN and the second semiconductor layer and the third semiconductor layer comprise GaN.

8. The apparatus of claim 1, wherein the resonator comprises:
    a photonic crystal, the photonic crystal including:
        a first line defect to receive the plurality of probe photons;
        a first point defect to define a first cavity having a first resonant frequency $\omega_1$;
        a second point defect to define a second cavity having a second resonant frequency $\omega_2$ and a linewidth $\Gamma_2$, a difference between the first resonant frequency and the second resonant frequency $|\omega_1 - \omega_2|$ being substantially equal to the linewidth $\Gamma_2$, the first cavity and the second cavity defining a photonic waveguide to store the plurality of probe photons; and
    a second line defect to output the at least some of the plurality of probe photons.

9. The apparatus of claim 1, wherein the resonator comprises:
    an input waveguide; and
    a micro-ring resonator, evanescently coupled to the input waveguide, to receive the plurality of probe photons via the input waveguide.

10. The apparatus of claim 9, wherein the input waveguide comprises:
    a first section, evanescently coupled to a first location of the micro-ring resonator, to couple out a first portion of the plurality of probe photons; and
    a second section, evanescently coupled to a second location of the micro-ring resonator, to couple out a second portion of the plurality of probe photons, the second portion destructively interfering with the first portion.

11. The apparatus of claim 1, wherein the absorber comprises a III-N semiconductor.

12. The apparatus of claim 1, wherein the absorber comprises a semiconductor having a bandgap energy at least two times greater than a photon energy of the probe photons in the plurality of probe photons.

13. The apparatus of claim 1, wherein the resonator comprises:
a first reflector having a first reflectance greater than 99.9% at the second wavelength; and
a second reflector disposed opposite the first reflector and having a second reflectance less than 99.5% at the second wavelength.

14. A method of detecting a signal photon at a first wavelength, the method comprising:
coupling a plurality of probe photons at a second wavelength, different from the first wavelength, into a resonator, the resonator including an absorber disposed at least partially in the resonator and substantially transparent to the plurality of probe photons;
absorbing the signal photon with the absorber, the absorber changing a resonant wavelength of the resonator in response to absorption of the signal photon, thereby releasing at least some of the plurality of probe photons from the resonator; and
detecting the at least some of the plurality of probe photons; and
determining a presence of the signal photon based on detection of the at least some of the plurality of probe photons.

15. The method of claim 14, wherein coupling the plurality of probe photons into the resonator comprises transmitting the plurality of probe photons through a first DBR disposed opposite a second DBR and wherein absorbing the signal photon comprises coupling the signal photon into a semiconductor heterostructure disposed between the first DBR and the second DBR.

16. The method of claim 15, wherein absorbing the signal photon comprises transmitting the signal photon through a first semiconductor layer having a first bandgap disposed between two second semiconductor layers having a second bandgap greater than the first bandgap.

17. The method of claim 14, wherein coupling the plurality of probe photons comprises transmitting the plurality of probe photons through a first line defect in a photonic crystal to a photonic waveguide defined by a first point defect and a second point defect, and wherein detecting the at least some of the plurality of probe photons comprises transmitting the at least some of the plurality of probe photons through a second line defect in the photonic crystal to a detector.

18. The method of claim 14, wherein coupling the plurality of probe photons comprises:
transmitting the plurality of probe photons through a first section of an input waveguide evanescently coupled to a first location of a ring resonator so as to couple out a first portion of the plurality of probe photons; and
transmitting the plurality of probe photons through a second section of the input waveguide evanescently coupled to a second location of the ring resonator so as to couple out a second portion of the plurality of probe photons, the second portion destructively interfering with the first portion.

19. The method of claim 14, wherein absorbing the signal photon comprises absorbing the signal photon with a III-N semiconductor having a bandgap energy at least two times greater than a photon energy of the plurality of probe photons.

20. The method of claim 14, wherein coupling the plurality of probe photons comprises transmitting the plurality of photons through a first reflector having a first reflectance less than 99.5% at the second wavelength and disposed opposite a second reflector and having a second reflectance greater than 99.9% at the second wavelength.

21. A single-photon detector to detect a signal photon at a signal wavelength, the single-photon detector comprising:
an input waveguide to receive a plurality of probe photons at a probe wavelength less than half of the signal wavelength;
a micro-ring resonator, evanescently coupled to the input waveguide, to receive the plurality of probe photons, the input waveguide comprising:
a first section, evanescently coupled to a first location of the micro-ring resonator, to couple out a first portion of the plurality of probe photons; and
a second section, evanescently coupled to a second location of the micro-ring resonator, to couple out a second portion of the probe photons, the second portion destructively interfering with the first portion;
an absorber, disposed at least partially in the micro-ring resonator and substantially transparent at the probe wavelength, to absorb the signal photon, absorption of the signal photon causing a change of a resonant wavelength of the micro-ring resonator releasing at least some of the plurality of probe photons from the micro-ring resonator, the absorber comprising a III-N semiconductor having a bandgap energy at least two times greater than a photon energy of the probe photons in the plurality of probe photons; and
a detector, in optical communication with the resonator, to detect the at least some of the plurality of probe photons.

* * * * *